March 21, 1967 H. KÖLLNER ET AL 3,310,216

APPARATUS FOR BONDING CONDUCTORS TO SEMICONDUCTOR MEMBERS BY THERMOCOMPRESSION

Filed Jan. 2, 1964 2 Sheets-Sheet 1

3,310,216
Patented Mar. 21, 1967

3,310,216

APPARATUS FOR BONDING CONDUCTORS TO SEMICONDUCTOR MEMBERS BY THERMOCOMPRESSION

Hartwig Köllner, Hans Rebstock, Helmut Schädlich, and Dietrich Schloss, Munich, Germany, assignors to Siemens & Halske Aktiengesellschaft, Berlin, Germany, a corporation of Germany Filed Jan. 2, 1964, Ser. No. 335,323
Claims priority, application Germany, Jan. 2, 1963, S 83,130
21 Claims. (Cl. 228—5)

Our invention relates to a method and apparatus for attaching electrodes and other electric contacts to semiconductor members by thermocompression. This method is hereinafter referred to as contact bonding.

The known thermocompression methods afford producing a mechanically solid bond between metals or between metals and semiconductors by applying pressure and heat, without the use of flux and solder and without melting the metal or mechanically damaging the semiconductor crystal. A thermocompression contact bond is made by using a heated plunger for pressing a usually very thin, soft metal wire onto a likewise heated semiconductor body. This method is employed in various semiconductor techniques, for example for attaching wires to the vapor-deposited metal spots of mesa and planar transistors, or to solid-state microelectronic circuits. Generally, this method can be used advantageously for microelectronics, that is whenever a contact locality of very small geometric dimensions is to be joined with a connecting wire.

It is an object of our invention to devise methods and means that satisfactorily and reliably permit large-scale or mass production of such micro-connections by thermocompression, so that this type of contact bond can be industrially produced by fabricating machinery of economical performance.

For producing a connection by thermocompression, three points in space must be made to coincide in the following sequence: point of contact, connecting wire, pressure plunger. Particular difficulties arise from the minute size of the device to be connected. Thus, a wire or strip-shaped terminal or connecting piece between a semiconductor electrode and the housing lead-in may have to be attached by thermocompression to the contact spot of a mesa transistor having for example, a spot size of only 15 x 40 microns. Furthermore, the lead-in conductors passing through the base plate must likewise be connected with the wire- or strip-shaped connecting piece consisting of an extremely thin gold wire of 7-micron diameter, for instance. In many instances it is further necessary to connect two points of contact only a few millimeters apart. It is necessary therefore to adjust wire and plunger to the point of contact with an accuracy in the order of microns. On the other hand, comparatively large distances must be travelled by the wire and plunger from one to the next point of contact.

It is therefore another object of our invention to provide equipment reliably capable of providing for accurate motion of wire and plunger in both of these greatly diverse ranges of displacement.

According to a feature of our invention, we provide a feeder for the connecting wire and a guide for the plunger, mounted one above the other, upon a micromanipulator which is movable in the $x$–$y$ plane relative to a supporting table structure that is heated when in operation and which carries the semiconductor device to be contact-bonded by thermocompression. We further move the wire feeder in the $x$–$y$ plane together with a corresponding movement of the plunger guide, and we also provide for additional adjusting movement of the plunger in the $x$–$y$ plane, adjusting movement of the plunger and the connecting wire in the $z$ direction, and for severing the connecting wire, a microscope being used for viewing the locality at which the contact bonding is to take place.

An apparatus according to the invention therefore is so constructed that the plunger follows all the movements in the $x$–$y$ plane when the wire is being adjusted in the $x$–$y$ plane and, during the actual contact bonding, requires only a minimum of readjustment by an additionally provided adjusting device which permits supplementary movement of the plunger in the $x$–$y$ plane. Because of this preadjusting of the plunger by adjustment of the wire, the resetting range of the plunger and, consequently, the supplementary movement in the $x$–$y$ plane, can be kept to a minimum. This critical readjusting in the $x$–$y$ plane can therefore be carried out to a very fine degree, such as with a large gear ratio.

According to the invention, the feeder for the connecting wire as well as the guide for the plunger are secured to a movable micromanipulator. The micromanipulator is mounted on a compound table that is equipped with respective adjusting devices for movement in the $x$ and the $y$ direction for displacing the micromanipulator in the $x$–$y$ plane, in order to adjust the wire in the $x$–$y$ plane with respect to the point of contact bonding. Coarse and fine adjusting means are provided to carry out the relatively greater movement of the wire and plunger from one point of contact bonding to another and also to afford a precise adjustment of the wire in the $x$–$y$ plane.

The normal or standard $z$-setting of a micromanipulator may be employed, for instance, in adjusting the movement of the connecting wire in the $z$-direction. The plunger will thereby also be forcibly moved in the same direction. According to a preferred embodiment of the invention, a special adjusting device is provided which permits the movement of the connecting wire in the $z$-direction independently of the plunger movement in the same direction. Such an embodiment permits completely separate adjustment of the wire feeder and the plunger elevations by providing two separate $z$-settings for the micromanipulator. When the wire feeder is moved in the $z$-direction, the plunger is no longer moved up and down but rather continues to maintain the same relative position with respect to the heating stage or the point of contact bonding. A special control lever can be provided for the movement of the plunger in the $z$-direction. It is particularly advantageous though for the control lever which controls the independent movement of the plunger in the $x$–$y$ plane also to control the movement of the plunger in the $z$-direction. In the hereinafter described embodiment, for example, the plunger guide can be fastened to the cantilever of the micromanipulator and be moved by means of a control lever in the $x$–$y$ plane, and by turning this control lever the plunger can be lowered or raised by a linkage, i.e. moved in the $z$-direction.

It is especially advantageous when the adjusting device, which is provided for the movement of the plunger in the $z$-direction, only moves the plunger itself and not the plunger guide. When the plunger is moved in the $z$-direction, the relatively large mass of the plunger guide consequently remains immobile. This greatly reduces the possibility of the plunger going out of adjustment when it is lowered. The plunger guide must meet very strict requirements, and the plunger shaft to which the plunger head is attached, must slide in the guide with the least possible play and friction. According to the invention, this is achieved by having the plunger shaft glide between balls impressed in screws or threaded pins. A hard cutting pin is conveniently used as plunger shaft, and three screws or threaded pins are provided.

The wire feeder also plays an essential part in the operability of the device and must be so constructed that the extremely thin connecting wire used in the contact bonding can be handled directly from the roll. The wire must furthermore leave the feeder in as straight condition as possible. According to the invention, the connecting wire is drawn from the supply spool through a nozzle made of glass or metal which is provided on the end of the wire feeder that is turned toward the point of contact bonding. This nozzle can, for instance, be a capillary tube with a 30$\mu$ diameter. Since wire feeders of this type must handle, for example, wires having a diameter of 7$\mu$ and a tensile strength of 0.3 to 0.4 gram, a perfectly balanced, low-friction spool mounting is essential, and also any reversing movement of the spool and consequent withdrawal of the wire must be avoided. A balanced and low-friction spool mounting is also important because such a spool is necessary for unreeling the wire from the roll with only a minimum pull. The necessary pull should be for example substantially between 0.1 and 0.2 gram.

According to a further aspect of the invention, a braking device of felt, Teflon, spun nylon, or similar material, is provided along the length of the wire between the supply spool and the nozzle. The wire from a supply spool thus passes over a brake, which provides additional assurance against withdrawal of the wire.

Since it is also advantageous for the wire to be fed through the nozzle to the point of contact bonding with a straight end and for that end possibly to protrude several millimeters, it is therefore also provided, according to the invention, that the plane in which the supply spool is unreeled, the brake and the centerline of the nozzle all lie in a straight line. The nozzle of the wire feeder can, for instance, be encircled by a heating device in order to anneal the wire, which had been cold-hardened by the drawing action, before it is processed further.

According to another aspect of the invention, there is provided a shearing or cut-off device, which is adjustable for cutting the wire so that a portion of the same length always protrudes from the nozzle. This is effected in accordance with further features of the invention by mounting the cut-off device in such a manner that its position in the $x$–$y$ plane relative to the connecting wire remains unchanged by any movement of the wire in this plane. The cut-off device can, therefore, be mounted as a unit on the compound table and thus always maintains the same relative position with respect to the wire feeder.

The microscope provided for viewing the point of contact bonding is so constructed that the work that is being performed can be viewed directly from an oblique angle. The actual contact bonding, i.e., the lowering of the plunger and the deformation of the connecting wire can thereby be observed. This permits drastic reduction of the number of rejects which result from inexact contact bonding, such as that of the vapor deposited spots of mesa transistors. It is possible that the preadjusted connecting wire will be thrown out of adjustment again by unavoidable minute vibrations. Such a disadjustment, which can no longer be corrected when viewed vertically, can be avoided when viewed obliquely, as provided by the invention.

The microscopic adjustment of the wire and plunger must frequently be made to several suitable magnifications in those instances when not only the electrode or semiconductor part are to be contact-bonded by thermocompression but also when the connecting wire and the lead-in through the housing are to be connected by thermocompression in the same operation. For example, it is necessary to change the lens four times when contact-bonding a mesa transistor whose emitter and base electrodes and the corresponding lead-ins through the housing are to be bonded; great magnification (for instance about 150 times) is necessary for contact-bonding emitter and base electrodes, and a large field of vision is necessary for contact-bonding the lead-ins. However, a lesser magnification (for instance, an enlargement of only 10 to 15 times) is required to observe that last-mentioned operation. In order to change the objective lenses, a sliding guide member is provided, according to the invention. The required change in magnification is effected by sliding the objective lenses across the sliding guide member. It is particularly advantageous if the sliding does not have to be done by hand, and a motor is provided instead for causing, for example, an accessory device to slide the member. This accessory device can transform the rotation of the motor into reciprocatory motion of the sliding member and it is also possible to mount the motor as well as the accessory device in a place removed from the contact-bonding device, i.e., in a place where the vibration of the motor cannot interfere with the bonding process.

The system that is to be contact-bonded, such as the mesa transistor for example, is arranged on a heating stage, which is formed with suitable bores for the lead-in wires of the base plate. The diameters of these bores are kept as small as possible in order to insure that the wires engage the inner walls of the bores, because the emitter and base lead-in wire or the lead-in wire generally are self-heated more rapidly than by the glass encapsulation of the transistor, for example. In order to effect good heat contact of the housing base plate and of the semiconductor crystals accordingly with the heating stage, a downwardly pressing retaining device which can be swung to the side is also provided.

As noted hereinabove, it is advantageous that the contact bonding by thermocompression of the electrodes and the lead-ins through the housing with the aid of the connecting wire should take place in one operation. This is effected in accordance with the invention, by making the heating stage, which carries the semiconductor member that is to be contact-bonded, swingable or turnable in the $x$–$y$ direction. Then, after completing the contact bonding of the electrode, i.e. one of the two vapor-deposited spots of a mesa transistor for example, the plunger can again be raised and also the wire feeder can be placed at such a high position that the corresponding lead-in of the housing base plate will be carried under the connecting wire as the heating stage is subsequently turned in the $x$–$y$ direction. After the electrode and the respective lead-in or the semiconductor members respectively, are connected, it is necessary to unreel another length of connecting wire from the supply spool for contact-bonding the next electrode or the next semiconductor body. To accomplish this, the plate that carries the micromanipulator and that is movable in the $x$–$y$ plane is displaced in the $x$-direction just far enough that a suitable length of connecting wire is unwound from the supply spool. A stop or catch can be provided which will prevent any additional movement of the plate carrying the micromanipulator, and the cut-off device is adjusted at the stop location so that the connecting wire can be cut off directly behind the lead-in. Thereafter, the plate carrying the micromanipulator is displaced to a position for contact-bonding the next electrode or for removing the contact-bonded system.

The contact-bonding apparatus constructed in accordance with the invention also affords installing an elongated or round magazine to hold a greater number of objects or base plates, such as 10 to 20 for example, to be contact-bonded. A sorting mechanism can also be built into it. The invention, therefore, further contemplates employing elongated or round conveyor lattices or racks to supply the bodies to be processed or to remove the processed bodies. The heating stage can then be fed by a lattice brought up to the apparatus, and after the components have been contact-bonded, the processed body can be placed upon a second, empty lattice.

According to a further aspect of the invention, the holder supporting the semiconductor body can be constructed as a conveyor lattice, for example as an elongated lattice, and so constructed as to be turnable together with the heating device.

Other features which are considered as characteristic for the invention are set forth in the appended claims. The construction and method of operation of the invention, however, together with additional objects and advantages thereof will be best understood from the following description of specific embodiments when read in connection with the accompanying drawings. Although the invention has been illustrated and described as a method and apparatus for bonding conductors to semiconductor members by thermocompression, it is nevertheless not intended to be limited to the details shown, since various modifications and structural changes may be made therein without departing from the spirit of the invention and within the scope and range of equivalents of the claims.

Figure 1:
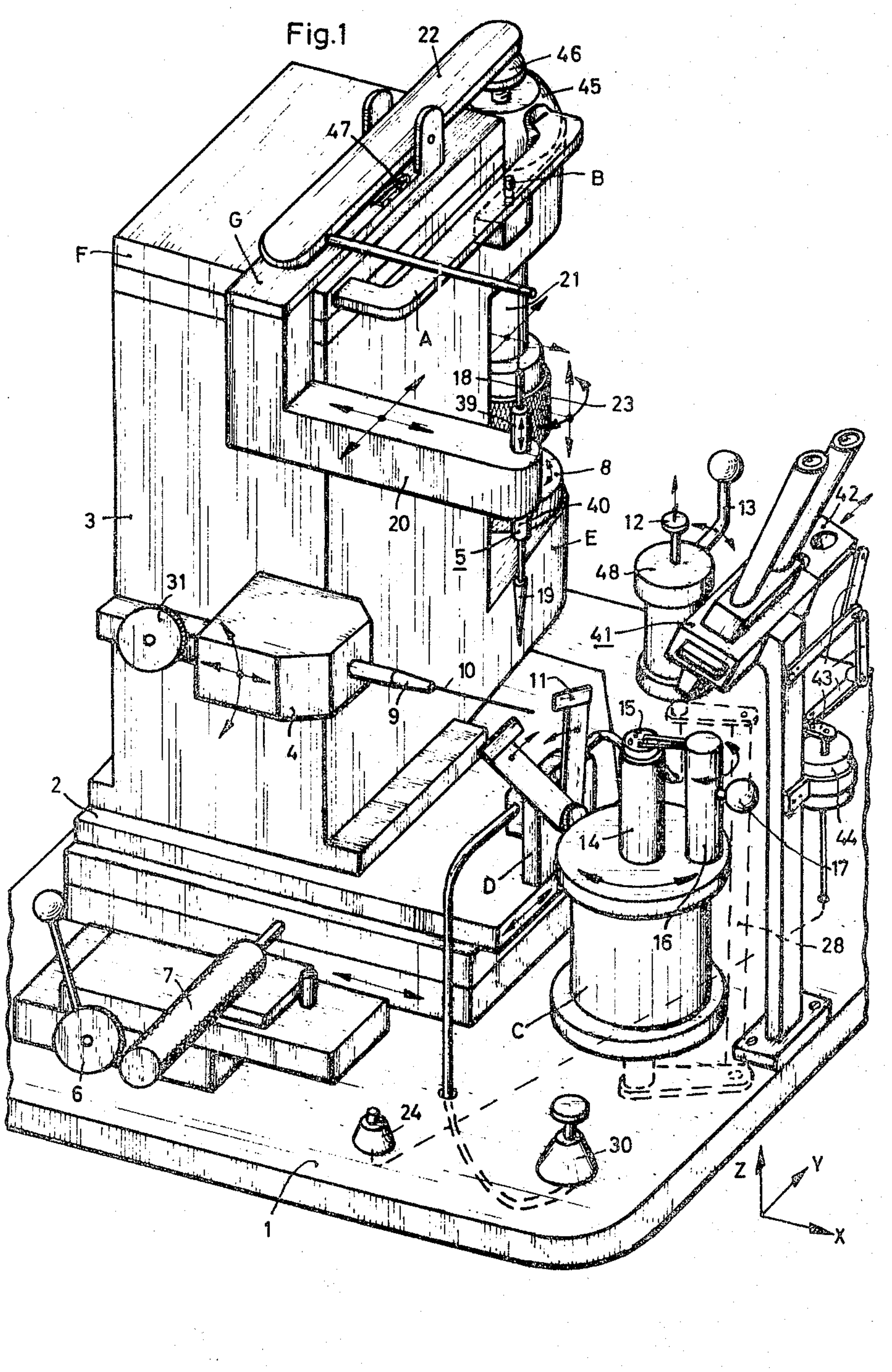
FIG. 1 is a perspective view of the bonding apparatus constructed in accordance with the invention.

Turning now to the drawings and particularly to FIG. 1, there is shown in the lower right-hand corner of the figure the system of coordinates which is to be referred to hereinafter. Also shown in this figure are systems of arrows indicating the directions in which movement of various components of the apparatus is possible.

As shown in FIG. 1, a plate or machine bed 1 supports a compound table or cross-feed carriage 2 which is constructed in a known manner to move in the $x$ and $y$ directions. A micromanipulator 3 is mounted securely to the table 2. Known manipulatable devices 6 and 7 for adjusting the movement of the table in the $x$ and $y$ directions respectively (coarse and fine adjustment) are also provided. Depending upon the geometry of the areas of contact between the elements that are to be contact-bonded, it is usually sufficient to have a fine adjusting device only for the $y$ direction and a relatively coarse adjusting device only for the $x$ direction. This is particularly true when the dimensions of the areas to be contact-bonded are relatively greater in the $x$ direction than in the $y$ direction. The adjustment of the connecting wire 10 in the $x$ and $y$ directions is effected by the adjusting devices 6 and 7, since the wire 10 moves in those directions when the compound table 2 is so adjusted.

A spool of a connecting wire 10 is contained in a connecting wire-feeding mechanism 4 that is mounted on the front side as viewed in FIG. 1 of the micromanipulator by a fastening device 31, such as a set screw with an enlarged head having a knurled periphery. The end portion of the wire 10 which is to be contact-bonded projects outwardly from a glass or metal nozzle 9 that extends from the feeder 4. Movement of the connecting wire in the $z$ direction is effected by suitable gearing and linkages (not shown) within the pedestal of the micromanipulator 3 that are well known in the are and that are controlled by turning the adjusting knob 8. A shearing mechanism 11 for cutting off the portion of the connecting wire 10 that is contact-bonded is mounted on the compound table 2 so that its position relative to the wire 10 remains unchanged when the wire is moved in the $x$ or $y$ directions with the table 2. A flexible cable control 12 is suitably connected to the shearing device 11 for actuating the same. This cable control is built into a rotary head 48 which is used to rotate a heating stage 14. In order to operate the shearing device 11 with either hand, a second cable control 30 is also provided.

Rotation of the heating stage 14 is effected by manipulating a lever 13 over suitable linkages 28. The heating stage 14 is mounted on and rotates with a spool-shaped platform C on which the retaining device 16 is also mounted adjacent the heating stage. The retaining device 16 is provided at its upper end with a fork-shaped extension which is the only structure that holds the semiconductor body 15 down on the upper surface of the heater stage 14. Temperature losses from the heating stage and the semiconductor body that is to be contact-bonded are thereby minimized due to the prevention of excessive heat transfer therefrom through the retaining device 16. The point of connection between the wire 10 and the semiconductor body 15 is located between the tines of the fork-shaped extension of the retaining device 16. The retaining device 16 is turnably mounted on the platform C and can be swung aside by grasping the knob 17 secured thereto to release the semiconductor member 15.

A conical contact-bonding plunger 19 is fastened at its base end to an elongated rod 18 which is slidable in the $z$-direction in a hollow cylindrical guide 5. The plunger guide 5 is secured to a beam or cantilever arm 20 of the micromanipulator. The micromanipulator also comprises a generally spherical guide member 45 which is articulatingly mounted in a corresponding socket formed in a horizontal extension of the main supporting pedestal of the micromanipulator 3, a lever arm A pivotable about the pivot pin B, a plate-like sliding carriage F, and the component G which, with the cantilever arm 20, supports the contact-bonding plunger 19. The slide carriage F as well as one leg of the generally U-shaped lever arm A are in slidabe contact with the generally spherical guide member 45, while the opposite leg of the lever A is urged by suitable springs (not shown) into permanent contact with the slide F. A small pin projection (not shown) is provided on the side of the slide carriage F which is adjacent to the generally spherical guide member 45 and which is in slidable contact engagement with the latter. The location on the generally spherical guide member 45 at which the non-visible pin of the slide carriage F contacts the guide member 45 is spaced approximately 90° from the area of contact of the lever arm A with the guide member 45. The outer surface of the guide member 45 is not exactly spherical and is rather markedly curved in a different manner in its lower or meridional portion. Consequently, the contact positions of the lever A and of the slide carriage F with the guide member 45 will alter their distance radially from the center axis of the guide member 45 as the guide member 45 is turned about that axis, and the variation in radial distance will depend upon the disposition of the axis of rotation at the particular time to the body of the guide member 45. This results in a change in the direction of the lever arm A or the plate-shaped sliding carriage F either in the $x$ or the $y$ direction, which results in a displacement of the plate-shaped sliding carriage F. By swinging the arm 21 in the $x$ or $y$ direction and by rotating the arm 21, the generally spherical guide member 45 which is connected by means of a universal ball and socket connection to the supporting pedestal extension of the micromanipulator is turned about its center point. An adjusting screw 23, which raises and lowers a screw peg with a mushroom-shaped head 46 extending from the top of the guide member 45 is movable respectively with the latter since it is connected thereto. The arm 21, guide member 45, peg 46 and adjusting screw 23 constitute an auxiliary adjusting means. These foregoing features are characteristic of micromanipulators generally and are purely of a constructional nature which is of little importance as regards the basic manner of operation of our apparatus.

To actuate the contact-bonding plunger 19, there is provided a centrally pivoted lever arm 22 carrying the adjusting screw 23 which causes the peg with the mushroom-shaped head 46 to raise one end of the arm 22. When the peg with the mushroom-shaped head 46 is raised by the corresponding rotation or turning of the adjusting screw 23, then the end of the lever arm 22 which carries a laterally extending rod supporting the plunger 19 is caused to descend with the contact-bonding plunger 19 because of its weight, the pressure provided by the weight of the contact-bonding plunger 19 proper being sufficient for carrying out the contact-bonding process generally. The distribution of weight in the lever arm 22 is made in such a manner that the portion of the lever arm 22 on the side of the pivot which is closest to the peg 46 is heavy enough so as to maintain engagement with the mushroom-shaped head of the peg 46 at all times, or a spring 47 can be provided to constantly bias the lever arm 22 into engagement with the mushroom-shaped head of the peg 46. Consequently when the adjusting peg 46 is lowered by suitable manipulation of the adjusting screw 23, the contact-bonding plunger 19 is raised.

A pushbutton 24 is provided for operating a motor 44 which by suitable linkages 43 moves a slide 42 bearing objective lenses of different power for changing the magnification of the microscope 41 which is used to observe the contact bonding of the wire 10 to the semiconductor member 15.

Figures 5, 6:
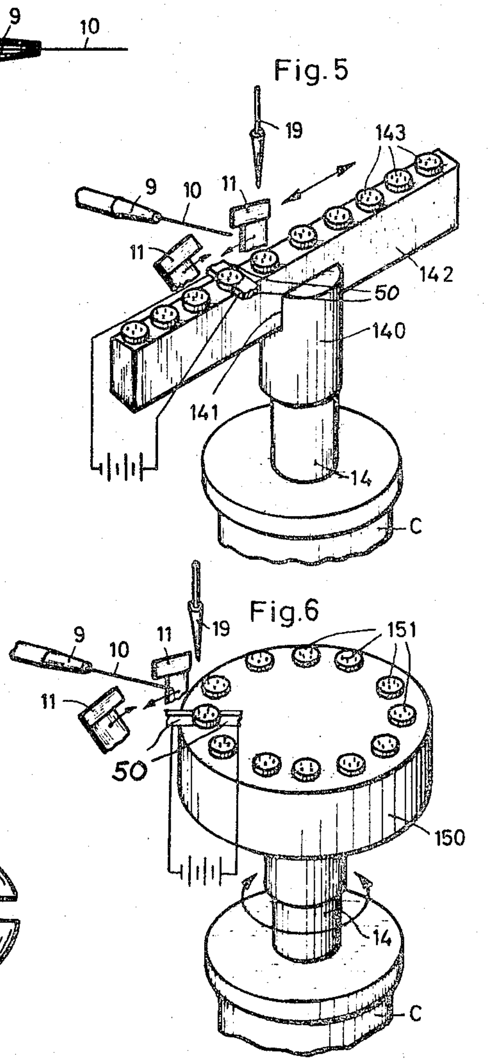
FIGS. 5 and 6 are views, respectively, of straight-line and circular conveyors for feeding the semiconductor members to the heating stage of the apparatus.

Instead of having the semiconductor member supported directly on a heating stage, a straight-line conveyor or longitudinal rack or lattice belt which supplies the semiconductor members to the apparatus for contact-bonding thereof can be used to hold the semiconductor body as it is being contact-bonded. When such a longitudinal lattice is used it would extend in the *y* direction of FIG. 1 within the field of view of the microscope and would be displaceable in that direction. In order to heat the semiconductor body which is to be contact-bonded, heating jaws 50, shown diagrammatically in FIGS. 5 and 6, can, for example, be brought up to the lattice from the upper and lower sides thereof from the *x* direction and primarily to that part of the lattice only that carries the semiconductor body that is to be contact-bonded. A suitable straight-line conveyor or longitudinal rack or lattice that can be used for feeding and supporting the semiconductor body while it is contact-bonded, is shown in FIG. 5. Similarly, a rotary circular type of conveyor or lattice structure can be employed for the same purpose as the lattice belt shown in FIG. 5, and an example of such a circular lattice is illustrated in FIG. 6.

When the apparatus of our invention is in operation, the positioning of the wire 10 in the *x–y* plane and the displacement of the lens slide 42 to provide adjustment of the microscope lenses, are carried out with the left hand. Movement of the connecting plunger 19 in the *x–y* plane and in the *z*-direction independently of the *x–y* movement of the connecting wire 10, actuation of shearing device 11, movement of the wire in the *z*-direction, and turning of the heating stage 14 and of the retaining device 16 are all performed by the right hand.

Figure 2:
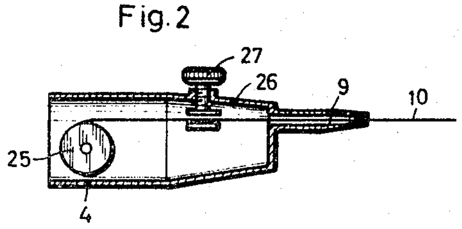
FIG. 2 is an elevational sectional view of the feeder forming part of the apparatus of FIG. 1.

FIG. 2 shows the feeder for the connecting wire in cross section. The wire feeder is provided with a housing 4. A supply spool 25 is mounted rotatably in the housing on bearings having least possible friction. After the end of the wire 10 has been contact-bonded to the semiconductor body, the compound table 2 is backed away from the semiconductor body 15 which is held firmly on the heating stage 14 by the fork-shaped extension of the retaining device 16 so that a length of the wire 10 is played out from the spool 25 through the nozzle 9. As this connecting wire 10 is being unwound from the supply spool 25, it passes across a brake 26. The braking action of the brake, which comprises two spaced felt linings for example, is adjustable by a screw 27 in relation to the tensile stress of the connecting wire. The adjusting screw 27 presses the two linings of the felt brake against each other to prevent the formation of slack in the wire 10. After the compound table 2 and consequently the feeder 4 have been withdrawn to a suitable location, the shearing device 11 is then actuated by the cable control 12 or 30 to cut the wire 10. The portion of the wire 10 which still extends from the nozzle 9 can now be again advanced to the next succeeding semiconductor body by suitably moving the compound table 2 toward the heating stage 14.

Figure 3:
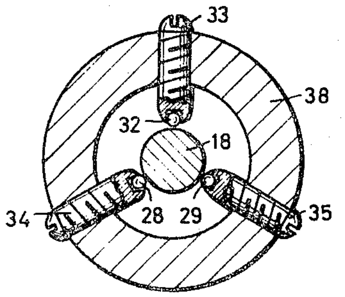
FIG. 3 is a horizontal sectional view of the plunger guide forming part of the apparatus of FIG. 1.

FIG. 3 shows the cylindrical guide 5 for the plunger which extends in the *z*-direction as shown in FIG. 1. Three externally threaded pins 33, 34 and 35 which can, of course, also consist of screws, are inserted through the sleeve 38 of the guide 5 spaced at an angle of 120° from one another. At those ends of the pins 35, 34 and 33 which face the plunger rod 18, are carried rotating balls 29, 28 and 32 respectively, which engage the plunger rod 18 about its periphery. These guide elements are arranged at the upper end 39 of the guide 5 as well as at the lower end 40 thereof.

Figure 4:
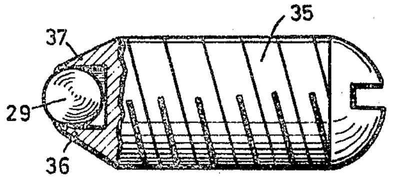
FIG. 4 is an enlarged longitudinal view of the threaded pin component of the plunger guide shown in FIG. 3.

In FIG. 4 there is shown an enlargement of one of the threaded pins. The ball-carrying end 36, 37 of the threaded pin is hollowed out to correspond to the radius of curvature of the ball and is bent inwardly at the end in order to retain the ball rotatably therein.

We claim:

1. An apparatus for contact-bonding conductors to a semiconductor member by thermocompression, comprising heating means for heating to contact-bonding temperature a semiconductor member supported on said heating means; micromanipulator means horizontally displaceable with respect to said heating means; feeding means carried by said micromanipulator means for supplying a conductor to be contact-bonded to the semiconductor member; pressure-applying means for exerting contact-bonding pressure at a contact locality on the conductor and the semiconductor member; guide means carried by said micromanipulator means for guiding said pressure-applying means in a vertical direction, said guide means being located above said feeding means and movable together with said feeding means when said micromanipulator means is horizontally displaced; and auxiliary adjusting means for additionally displacing said pressure-applying means horizontally and for relatively displacing said pressure-applying means and said conductor feeding means in a vertical direction.

2. An apparatus for contact-bonding conductors to a semiconductor member by thermocompression, comprising heating means for heating to contact-bonding temperature a semiconductor member supported on said heating means; a cross-feed carriage spaced from said heating means and provided with adjusting means for horizontally displacing said carriage; micromanipulator means mounted on said cross-feed carriage and horizontally displaceable therewith relative to said heating means; feeding means carried by said micromanipulator means for supplying a conductor to be contact-bonded to the semiconductor member; pressure-applying means for exerting contact-bonding pressure at a contact locality on the conductor and the semiconductor member; guide means carried by said micromanipulator means for guiding said pressure-applying means in a vertical direction, said guide means being located above said feeding means and movable together with said feeding means when said micromanipulator means is horizontally displaced; and auxiliary adjusting means for additionally displacing said pressure-applying means horizontally and for relatively displacing said pressure-applying means and said conductor feeding means in a vertical direction.

3. An apparatus for contact-bonding conductors to a semiconductor member by thermocompression, comprising heating means for heating to contact-bonding temperature a semiconductor member supported on said heating means; micromanipulator means displaceable with respect to said heating means in a horizontal direction; feeding means carried by said micromanipulator means for supplying a conductor to be contact-bonded to the semiconductor member; pressure-applying means for exerting contact-bonding pressure at a contact locality on the conductor and the semiconductor member; guide means carried by said micromanipulator means for guiding said pressure-applying means in a vertical direction, said guide means being located above said feeding means and movable together with said feeding means when said micromanipulator means is displaced in said horizontal direction; and auxiliary adjusting means for additionally displacing said pressure-applying means in said horizontal direction and for relatively displacing said pressure-applying means and said conductor feeding means in a vertical direction, and an independent adjustment member operatively connected to said conductor feeding means for displacing the conductor in a vertical direction independently of the displacement of said pressure-applying means in said vertical direction.

4. An apparatus for contact-bonding conductors to a semiconductor member by thermocompression, comprising heating means for heating to contact-bonding temperature a semiconductor member supported on said heating means; micromanipulator means displaceable with respect to said heating means in a horizontal plane; feeding means carried by said micromanipulator means for supplying a conductor to be contact-bonded to the semiconductor member; pressure-applying means for exerting contact-bonding pressure at a contact locality on the conductor and the semiconductor member; guide means carried by said micromanipulator means for guiding said pressure-applying means in a vertical direction, said guide means being located above said feeding means and movable together with said feeding means when said micromanipulator means is displaced in said horizontal plane; and auxiliary adjusting means for additionally displacing said pressure-applying means in said horizontal plane and for relatively displacing said pressure applying means and said conductor feeding means in a vertical direction, said auxiliary adjusting means being operatively connected to said pressure-applying means for independently and simultaneously displacing said pressure-applying means in said horizontal plane and in said vertical direction.

5. An apparatus according to claim 1, wherein said guide means is held against movement with said pressure-applying means in said vertical direction.

6. An apparatus according to claim 1, wherein the conductor consists of connecting wire and said feeding means includes a nozzle located adjacent to said contact locality, a supply roll of the connecting wire being unwound through said nozzle.

7. An apparatus according to claim 6, wherein said nozzle is made of glass.

8. An apparatus according to claim 6, wherein said feeding means includes a braking device located between the supply roll of connecting wire and said nozzle.

9. An apparatus according to claim 8, wherein the wire being unwound from the supply roll, said braking device and the longitudinal axis of said nozzle are collinear.

10. An apparatus for contact-bonding conductors to a semiconductor member by thermocompression, comprising heating means for heating to contact-bonding temperature a semiconductor member supported on said heating means; micromanipulator means displaceable with respect to said heating means in a horizontal plane; feeding means carried by said micromanipulator means for supplying a conductor to be contact-bonded to the semiconductor member; a plunger rod for exerting contact-bonding pressure at a contact locality on the conductor and the semiconductor member; guide means carried by said micromanipulator means for guiding said plunger rod in a vertical direction, said guide means comprising a plurality of spheres spaced around the periphery of and in rolling engagement with said plunger rod, said guide means being located above said feeding means and movable together with said feeding means when said micromanipulator means is displaced in said horizontal plane; and auxiliary adjusting means for additionally displacing said pressure-applying means in said horizontal plane and for relatively displacing said pressure-applying means and said conductor feeding means in a vertical direction.

11. An apparatus according to claim 10, wherein said spheres are mounted on the ends of threaded pin members adjustable in the radial direction of said plunger rod.

12. An apparatus for contact-bonding wire conductors to a semiconductor member by thermocompression, comprising heating means for heating to contact-bonding temperature a semiconductor member supported on said heating means; micromanipulator means displaceable with respect to said heating means in a horizontal plane; feeding means carried by said micromanipulator means for continuously supplying from a supply roll connecting wire to be contact-bonded to the semiconductor member; pressure applying means for exerting contact-bonding pressure at a contact locality on the connecting wire and the semiconductor member; guide means carried by said micromanipulator means for guiding said pressure-applying means in a vertical direction, said guide means being located above said feeding means and movable together with said feeding means when said micromanipulator means is displaced in said horizontal plane; auxiliary adjusting means for additionally displacing said pressure-applying means in said horizontal plane and for relatively displacing said pressure-applying means said said wire-feeding means in a vertical direction; and cut-off means for cutting off portions of the contact-bonded connecting wire from the supply roll.

13. An apparatus according to claim 12, wherein the connecting wire is movable in said horizontal plane, and the position of said cut-off means in said horizontal plane relative to the connecting wire remains the same when the wire is moved in said horizontal plane.

14. An apparatus for contact-bonding conductors to a semiconductor member by thermocompression, comprising heating means for heating to contact-bonding temperature a semiconductor member supported on said heating means; micromanipulator means displaceable with respect to said heating means in a horizontal plane; feeding means carried by said micromanipulator means for supplying a conductor to be contact-bonded to the semiconductor member; pressure-applying means for exerting contact-bonding pressure at a contact locality on the conductor and the semiconductor member; guide means carried by said micromanipulator means for guiding said pressure-applying means in a vertical direction, said guide means being located above said feeding means and movable together with said feeding means when said micromanipulator means is displaced in said horizontal plane; auxiliary adjusting means for additionally displacing said pressure-applying means in said horizontal plane and for relatively displacing said pressure-applying means and said conductor feeding means in a vertical direction; and optical means for viewing said contact locality.

15. An apparatus according to claim 14, wherein said optical means comprises a microscope located adjacent said heating means and having an optical axis disposed obliquely with respect to said contact locality.

16. An apparatus according to claim 15, wherein said optical means includes a slide member slidable transversely to the optical axis of said microscope for changing the objective lenses of said microscope.

17. An apparatus according to claim 16, including motor means for actuating said slide member.

18. An apparatus for contact-bonding conductors to a semiconductor member by thermocompression, comprising heating means for heating a semiconductor member to contact-bonding temperature, said heating means including a heating stage supporting the semiconductor member and turnable in a horizontal plane; micromanipulator means displaceable with respect to said heating means in said horizontal plane; feeding means carried by said micromanipulator means for supplying a conductor to be contact-bonded to the semiconductor member; pressure applying means for exerting contact-bonding pressure at a contact locality on the conductor and the semiconductor member; guide means carried by said micromanipulator means for guiding said pressure-applying means in a vertical direction, said guide means being located above said feeding means and movable together with said feeding means when said micromanipulator means is displaced in said horizontal plane; and auxiliary adjusting means for additionally displacing said pressure-applying means in said horizontal plane and for relatively displacing said pressure-applying means and said conductor feeding means in a vertical direction.

19. An apparatus for contact-bonding conductors to a semiconductor member by thermocompression, comprising heating means for heating a semiconductor member to contact-bonding temperature; conveyor means for successively supplying semiconductor members to said heating means and for removing the semiconductor members from said heating means; micromanipulator means displaceable with respect to said heating means in a horizontal plane; conductor feeding means carried by said micromanipulator means for supplying a conductor to be contact-bonded to the semiconductor member; pressure-applying means for exerting contact-bonding pressure at a contact locality on the conductor and the semiconductor member; guide means carried by said micromanipulator means for guiding said pressure-applying means in a vertical direction, said guide means being located above said feeding means and movable together with said feeding means when said micromanipulator means is displaced in said horizontal plane; and auxiliary adjusting means for additionally displacing said pressure-applying means in said horizontal plane and for relatively displacing said pressure-applying means and said conductor feeding means in a vertical direction.

20. An apparatus according to claim 19, wherein said conveyor is a straight-line lattice belt movable in a horizontal plane and said heating means comprises a pair of heating jaws.

21. An apparatus according to claim 19, wherein said conveyor is a circular lattice structure rotatable in a horizontal plane and said heating means comprises a pair of heating jaws.

References Cited by the Examiner

UNITED STATES PATENTS 3,149,510 9/1964 Kulicke ------------ 228—44

JOHN F. CAMPBELL, *Primary Examiner.*

M. L. FAIGUS, *Assistant Examiner.*